(12) United States Patent
Seong

(10) Patent No.: US 7,660,185 B2
(45) Date of Patent: Feb. 9, 2010

(54) CHIP SELECT CONTROLLER AND NON-VOLATILE MEMORY DEVICE INCLUDING THE SAME

(75) Inventor: Jin Yong Seong, Seoul (KR)

(73) Assignee: Hynix Semiconductor Inc., Icheon-si (KR)

( * ) Notice: Subject to any disclaimer, the term of this patent is extended or adjusted under 35 U.S.C. 154(b) by 102 days.

(21) Appl. No.: 12/102,705

(22) Filed: Apr. 14, 2008

(65) Prior Publication Data

US 2009/0168518 A1 Jul. 2, 2009

(30) Foreign Application Priority Data

Dec. 28, 2007 (KR) .................... 10-2007-0140145

(51) Int. Cl.
*G11C 8/00* (2006.01)
(52) U.S. Cl. .................. 365/230.03; 710/105
(58) Field of Classification Search ........... 365/230.03, 365/230.08; 710/105
See application file for complete search history.

(56) References Cited

U.S. PATENT DOCUMENTS 5,673,398 A * 9/1997 Takeda ................. 710/105

FOREIGN PATENT DOCUMENTS

| JP | 2005-209814 | 8/2005 |
|---|---|---|
| JP | 2005-285295 | 10/2005 |
| KR | 1020000056711 A | 9/2000 |
| KR | 1020010063182 A | 7/2001 |

* cited by examiner

*Primary Examiner*—Vu A Le
(74) *Attorney, Agent, or Firm*—Townsend and Townsend and Crew LLP

(57) ABSTRACT

A chip select controller for a non-volatile memory device includes a first chip enable signal transfer unit, a second chip enable signal transfer unit, a first chip select pad, a second chip select pad, a third chip select pad and a chip select unit. The first chip enable signal transfer unit buffers first and second chip enable signals according to a control signal. The second chip enable signal transfer unit buffers third and fourth chip enable signals according to the control signal. The first chip select pad is configured to transfer a first chip select signal. The second chip select pad is configured to transfer a second chip select signal. The third chip select pad is configured to transfer the second chip select signal. The chip select unit addresses a specific chip according to the first chip select signal and the second chip select signal.

13 Claims, 4 Drawing Sheets

FIG. 4

| Chip | Chip enable signal | First chip select signal | Second chip select signal | IO Channel |
|---|---|---|---|---|
| 1 | First chip enable signal | Vss | Vss | IO0<7:0> |
| 3 | | | Vcc | |
| 2 | | Vcc | Vss | IO1<7:0> |
| 4 | | | Vcc | |
| 6 | | Vss | Vss | IO1<7:0> |
| 8 | | | Vcc | |
| 5 | | Vcc | Vss | IO0<7:0> |
| 7 | | | Vcc | |
| 9 | Second chip enable signal | Vss | Vss | IO0<7:0> |
| 11 | | | Vcc | |
| 10 | | Vcc | Vss | IO1<7:0> |
| 12 | | | Vcc | |
| 14 | | Vss | Vss | IO1<7:0> |
| 16 | | | Vcc | |
| 13 | | Vcc | Vss | IO0<7:0> |
| 15 | | | Vcc | |
| 17 | Third chip enable signal | Vss | Vss | IO0<7:0> |
| 19 | | | Vcc | |
| 18 | | Vcc | Vss | IO1<7:0> |
| 20 | | | Vcc | |
| 22 | | Vss | Vss | IO1<7:0> |
| 24 | | | Vcc | |
| 21 | | Vcc | Vss | IO0<7:0> |
| 23 | | | Vcc | |
| 25 | Fourth chip enable signal | Vss | Vss | IO0<7:0> |
| 27 | | | Vcc | |
| 26 | | Vcc | Vss | IO1<7:0> |
| 28 | | | Vcc | |
| 30 | | Vss | Vss | IO1<7:0> |
| 32 | | | Vcc | |
| 29 | | Vcc | Vss | IO0<7:0> |
| 31 | | | Vcc | |

CHIP SELECT CONTROLLER AND NON-VOLATILE MEMORY DEVICE INCLUDING THE SAME

CROSS-REFERENCES TO RELATED APPLICATIONS

The present application claims priority to Korean patent application number 10-2007-140145, filed on Dec. 28, 2007, which is incorporated by reference in its entirety.

BACKGROUND OF THE INVENTION

The present invention relates to a chip select controller for a non-volatile memory device and a non-volatile memory device including the same.

In recent years, there has been an increasing demand for non-volatile memory devices which can be programmed and erased electrically and do not need a refresh function of rewriting data at specific intervals.

This makes it necessary to increase the capacity of non-volatile memory. Solutions for increasing the capacity of non-volatile memory may include: 1. a method in accordance with the development of process technology, 2. a method of increasing an amount of data stored per cell, and 3. a method of increasing the number of chips laminated per package. The present invention is concerned with the third method.

A non-volatile memory device adopts a Multi-Chip Package (MCP) construction including a plurality of chips, such as a Double Die Package (DDP) including two dies, a Quadruple Die Package (QDP) including four dies, and a Dual Stack Package (DSP) in which the DDP or QDP is laminated in two layers.

In line with the necessity to increase the capacity of non-volatile memory, there is a need for a technique that is able to laminate more dies in one package.

BRIEF SUMMARY OF THE INVENTION

The present invention is directed towards a chip select controller that controls a large number of chips or dies laminated within one package.

The present invention is further directed towards a non-volatile memory device including the chip select controller.

A chip select controller according to an aspect of the present invention includes a first chip enable signal transfer unit, a second chip enable signal transfer unit, a first chip select pad, a second chip select pad, a third chip select pad and a chip select unit. The first chip enable signal transfer unit buffers first and second chip enable signals according to a level of a control signal. The second chip enable signal transfer unit buffers third and fourth chip enable signals according to the level of the control signal. The first chip select pad is connected to a ground voltage pad or a power supply voltage pad and is configured to transfer a first chip select signal. The second chip select pad is selectively connected to the power supply voltage pad and is configured to transfer a second chip select signal. The third chip select pad is selectively connected to the ground voltage pad and is configured to transfer the second chip select signal. The chip select unit addresses a specific chip according to the first chip select signal and the second chip select signal.

A non-volatile memory device according to an aspect of the present invention includes a first group of chips and a second group of chips. Each chip includes the chip select controller described above. The first group of chips are laminated to connect to a first I/O pad. The second group of chips are laminated to connect to a second I/O pad.

BRIEF DESCRIPTION OF THE DRAWINGS

FIG. 4 is a table listing signals applied when the laminated chips of the non-volatile memory device according to an embodiment of the present invention are selected.

DESCRIPTION OF SPECIFIC EMBODIMENTS

Specific embodiments according to the present invention will be described with reference to the accompanying drawings. However, the present invention is not limited to the disclosed embodiments, but may be implemented in various configurations. The embodiments are provided to complete the disclosure of the present invention and to allow those having ordinary skill in the art to understand the present invention. The present invention is defined by the scope of the claims.

Figure 1:
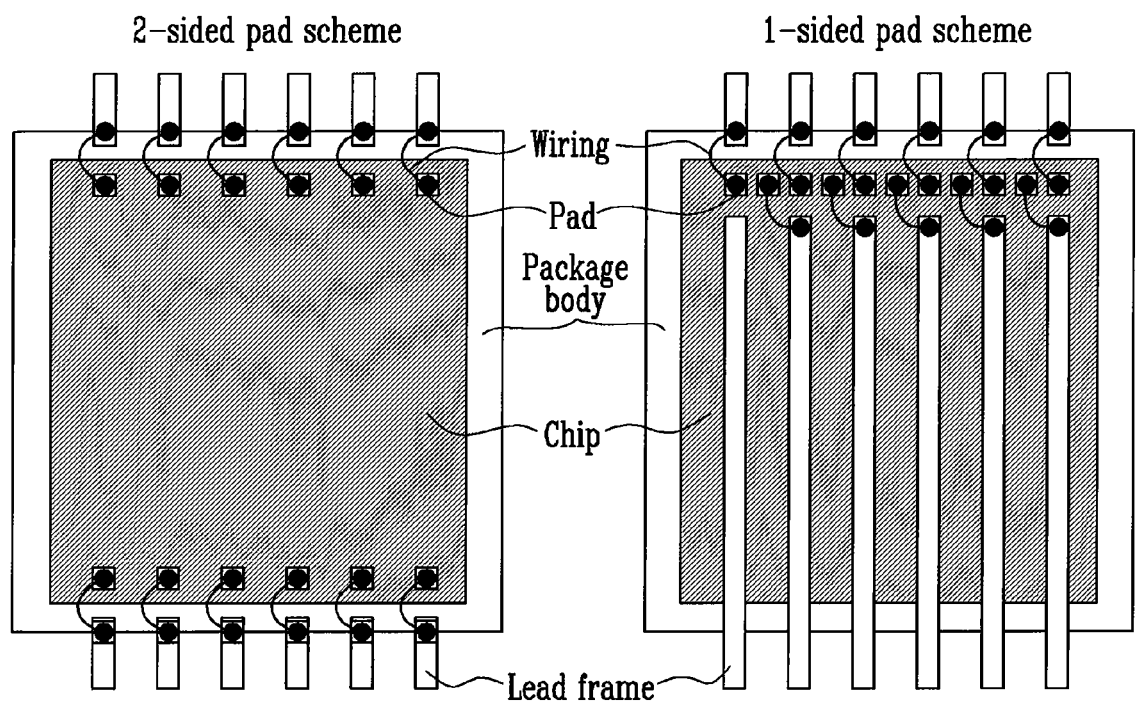
FIG. 1 is a view illustrating a comparison of a two-sided pad scheme and a one-sided pad scheme.

FIG. 1 is a view illustrating a comparison of a two-sided pad scheme and a one-sided pad scheme.

In a two-sided pad scheme, a lead frame and a pad (i.e., a wiring subject) are arranged on both sides of a chip. In a one-sided pad scheme, a pad is arranged only on one side of a chip, and a lead frame on one side is extended longer than a lead frame on the other side. In particular, in the case of the one-sided pad scheme, a designer can change the length of the lead frame when the location of the pad is changed.

In view of the difference in the construction of the two-sided pad scheme and the one-sided pad scheme, the one-sided pad scheme may be advantageous in terms of area since the pad is arranged only on one side. On the other hand, in the two-sided pad scheme, when it is necessary for a pad on one side to contact with a pad on the other side, a metal line is required within the chip. Thus, the two-sided pad scheme may have a relatively poorer RC characteristic than that of the one-sided pad scheme.

Accordingly, the present invention proposes a chip select controller which can be used effectively even in the one-sided pad scheme.

Figure 2:
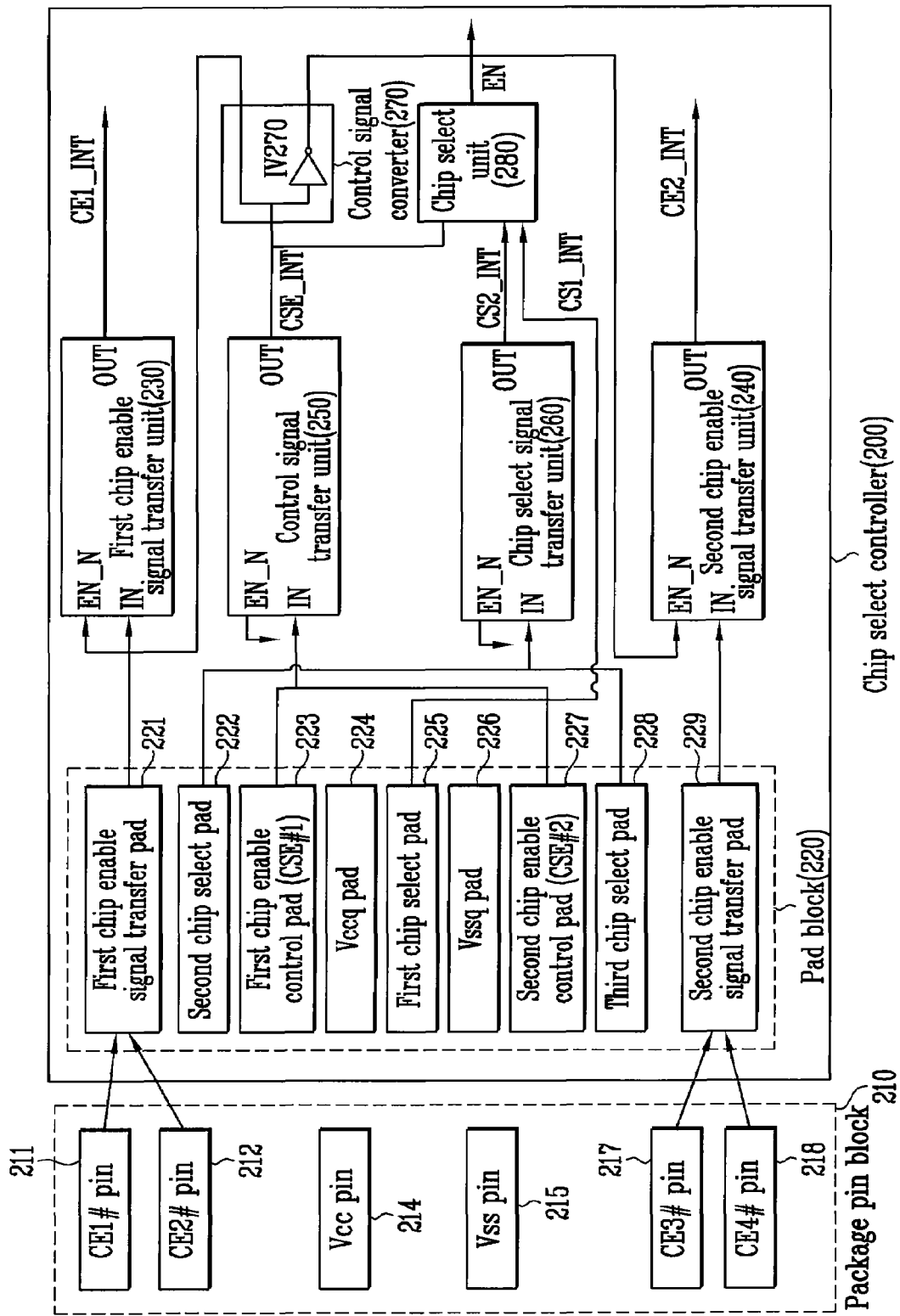
FIG. 2 is a block diagram of a chip select controller according to an embodiment of the present invention.

FIG. 2 is a block diagram of a chip select controller according to an embodiment of the present invention.

The chip select controller 200 is included in each chip that is packaged. A package pin block 210 is disposed outside the chip.

A first pin 211 included in the package pin block 210 is applied with a first chip enable signal CE1#, a second pin 212 is applied with a second chip enable signal CE2#, a third pin 217 is applied with a third chip enable signal CE3#, and a fourth pin 218 is applied with a fourth chip enable signal CE4#. A power supply voltage VCC and a ground voltage VSS are supplied through pins 214 and 215. The illustrated example corresponds to a case where a total of four chips are laminated, but the number of the pins may be changed according to the number of chips.

The chip select controller 200 includes first and second chip enable signal transfer pads 221 and 229, a first chip select pad 225, second and third chip select pads 222 and 228, first and second chip enable control pads 223 and 227, first and second chip enable signal transfer units 230 and 240, a control signal transfer unit 250, a chip select signal transfer unit 260, a control signal converter 270, and a chip select unit 280. Each of the pads is included in a pad block 220. A power supply voltage (Vccq) pad 224 and a ground voltage (Vssq) pad 226 are also included in the pad block 220.

The first chip enable signal transfer pad 221 transfers the first and second chip enable signals CE1# and CE2#, which are received from the pins 211 and 212 outside the chip, to the inside of the chip.

The second chip enable signal transfer pad 229 transfers the third and fourth chip enable signals CE3# and CE4#, which are received from the pins 217 and 218 outside the chip, to the inside of the chip.

The first chip enable signal transfer unit 230 selectively transfers the first and second chip enable signals CE1# and CE2#, which are received from the first chip enable signal transfer pad 221, to the inside of the chip.

The second chip enable signal transfer unit 240 selectively transfers the third and fourth chip enable signals CE3# and CE4#, which are received from the second chip enable signal transfer pad 229, to the inside of the chip.

Each of the enable signal transfer units 230 and 240 is activated in response to a signal of a low level. Control signals output from the first and second chip enable control pads 223 and 227 serve as the activation signals.

The first chip enable control pad 223 and the second chip enable control pad 227 transfer the control signals for activating the chip enable signal transfer units 230 and 240, respectively, from the outside of the chip to the inside of the chip.

The first chip enable control pad 223 is selectively connected to the ground voltage (Vssq) pad 226 and transfers the ground voltage to the control signal transfer unit 250.

The second chip enable control pad 227 is selectively connected to the power supply voltage (Vccq) pad 224 and transfers the power supply voltage to the control signal transfer unit 250.

When the first chip enable control pad 223 is connected to the ground voltage (Vssq) pad 226, the second chip enable control pad 227 is not connected to the power supply voltage (Vccq) pad 224. When the second chip enable control pad 227 is connected to the power supply voltage (Vccq) pad 224, the first chip enable control pad 223 is not connected to the ground voltage (Vssq) pad 226.

The connection state of each chip enable control pad and the power supply voltage or ground voltage transfer pad is decided differently on a per chip basis. That is, in one chip, the first chip enable control pad 223 may be connected to the ground voltage (Vssq) pad 226, and in the other chip, the second chip enable control pad 227 may be connected to the power supply voltage (Vccq) pad 224.

The control signal transfer unit 250 buffers the control signal received from each chip enable control pad. The control signal converter 270 transfers the control signal to the first chip enable signal transfer unit 230 or the second chip enable signal transfer unit 240 after inverting or not inverting the control signal. The control signal activates each enable signal transfer unit. The control signal transfer unit 250 also transfers the control signal, which is received from each chip enable control pad, to the chip select unit 280. The chip select unit 280 determines which one of the four chip enable signals CE is input based on the control signal.

For example, in a structure in which the first chip enable control pad 223 is selectively connected to the ground voltage (Vssq) pad 226 and the second chip enable control pad 227 is selectively connected to the power supply voltage (Vccq) pad 224, when the ground voltage is transferred as the control signal, the chip select unit 280 determines that the first chip enable signal or the second chip enable signal is input. When the power supply voltage is transferred as the control signal, the chip select unit 280 determines that the third chip enable signal or the fourth chip enable signal is input.

The control signal converter 270 includes an inverter INV270 for inverting the control signal and transferring the control signal to the second chip enable signal transfer unit 240.

An operation of the controller is described below.

If the ground voltage is applied through the first chip enable control pad 223, i.e., the control signal of a low level is input to the control signal transfer unit 250, the control signal is transferred to the first chip enable signal transfer unit 230 and the second chip enable signal transfer unit 240 through the control signal converter 270. The control signal converter 270 transfers the control signal to the first chip enable signal transfer unit 230 without change. However, the control signal converter 270 inverts the control signal and transits a signal of a high level to the second chip enable signal transfer unit 240. Each of the first and second chip enable signal transfer units 230 and 240 is activated in response to a signal of a low level and, therefore, only the first chip enable signal transfer unit 230 is activated. Thus, only the first chip enable signal or the second chip enable signal input through the first chip enable signal transfer pad 221 is transferred to the inside of the chip.

If the power supply voltage is applied through the second chip enable control pad 227, i.e., the control signal of a high level is input to the control signal transfer unit 250, the control signal is transmitted to the first chip enable signal transfer unit 230 and the second chip enable signal transfer unit 240 through the control signal converter 270. The control signal converter 270 transfers the control signal to the first chip enable signal transfer unit 230 without change. However, the control signal converter 270 inverts the control signal and transmits a signal of a low level to the second chip enable signal transfer unit 240. Each of the first and second chip enable signal transfer units 230 and 240 is activated in response to a signal of a low level and, therefore, only the second chip enable signal transfer unit 240 is activated. Thus, only the third chip enable signal or the fourth chip enable signal input through the second chip enable signal transfer pad 229 is transferred to the inside of the chip.

The connection state of the first and second chip enable control pads, and the inverter of the control signal converter may be changed according to user selection. In other words, the first chip enable control pad 223 can be connected to the power supply voltage (Vccq) pad 224 and the second chip enable control pad 227 can be connected to the ground voltage (Vssq) pad 226. In the case where the control signal converter is as shown in FIG. 2, when the first chip enable control pad 223 is connected to the power supply voltage (Vccq) pad 224, the second chip enable signal transfer unit 240 will be activated.

The inverter of the control signal converter may be changed to invert the control signal transferred to the first chip enable signal transfer unit 230. In the case where the first chip enable control pad 223 is set to connect to the ground voltage (Vssq) pad 226, when the first chip enable control pad 223 is connected to the ground voltage (Vssq) pad, the second chip enable signal transfer unit 229 is activated. In the case where the first chip enable control pad 223 is set to connect to the power supply voltage (Vccq) pad 224, when the first chip enable control pad 223 is connected to the power supply voltage (Vccq) pad 224, the first chip enable signal transfer unit 221 is activated.

In accordance with this construction, only one of the first and second chip enable signal transfer units 221 and 229 can be activated. That is, as only one chip enable signal transfer unit is activated, a specific chip enable signal transfer pad can be prevented from being floated, thereby reducing current consumption.

The first chip select pad 225 is selectively connected to the power supply voltage (Vccq) pad 224 or the ground voltage (Vssq) pad 226.

The connection states of the first chip select pad 225 and the power supply voltage or ground voltage pad 224 or 226 is decided differently on a per chip basis. In other words, in one chip, the first chip select pad 225 may be connected to the power supply voltage (Vccq) pad 224, and in the other chip, the first chip select pad 225 may be connected to the ground voltage (Vssq) pad 226.

Furthermore, a first chip select signal CS1_INT transferred from the first chip select pad 225 is transmitted to the chip select unit 280.

The second chip select pad 222 is selectively connected to the power supply voltage (Vccq) pad 224 and the third chip select pad 228 is selectively connected to the ground voltage (Vssq) pad 226. However, if the second chip select pad 222 is connected to the power supply voltage (Vccq) pad 224, the third chip select pad 228 is not connected to the ground voltage (Vssq) pad 226. If the third chip select pad 228 is connected to the ground voltage (Vssq) pad 226, the second chip select pad 222 is not connected to the power supply voltage (Vccq) pad 224.

The connection state of each chip select pad and the power supply voltage (Vccq) or ground voltage (Vssq) pad is decided differently on a per chip basis. In other words, in one chip, the second chip select pad 222 may be connected to the power supply voltage (Vccq) pad 224, and in the other chip, the third chip select pad 228 may be connected to the ground voltage (Vssq) pad 226.

The chip select signal transfer unit 260 buffers signals transferred from the second and third chip select pads 222 and 228, and transfers the signals to the chip select unit 280. If the second chip select pad 222 is connected to the power supply voltage (Vccq) pad 224, the chip select signal transfer unit 260 transfers a second chip select signal CS2_INT of a high level to the chip select unit 280. If the third chip select pad 228 is connected to the ground voltage (Vssq) pad 226, the chip select signal transfer unit 260 transfers the second chip select signal CS2_INT of a low level to the chip select unit 280.

The chip select unit 280 decides which chip will be selected based on the first chip select signal CS1_INT, the second chip select signal CS2_INT or a control signal CSE_INT.

The selection method is described in detail below.

The present invention provides a chip select apparatus which uses a total of the four chip enable signals (CEs) as the inputs and can discriminate between thirty-two chips based on the chip select signal, the control signal, and the like.

Figure 3:
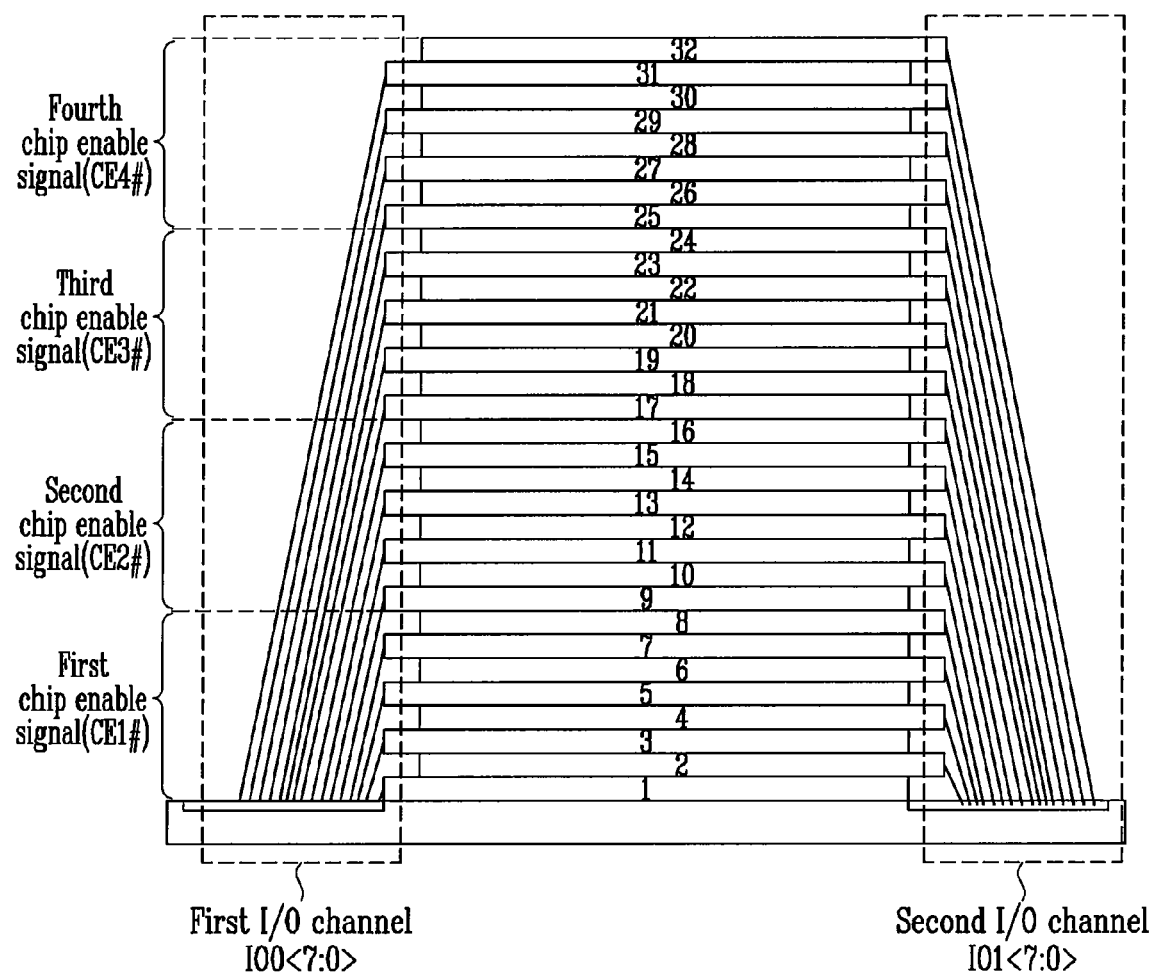
FIG. 3 is a view illustrating laminated chips of a non-volatile memory device according to an embodiment of the present invention.

FIG. 3 is a view illustrating laminated chips of a non-volatile memory device according to an embodiment of the present invention. FIG. 4 is a table listing signals applied when the laminated chips of the non-volatile memory device according to an embodiment of the present invention are selected.

Referring to FIG. 3, a non-volatile memory device 300 includes a first group of chips, which each include the chip select controller 200 and are laminated to connect to a first I/O pad, and a second group of chips, which each include the chip select controller 200 and are laminated to connect to a second I/O pad.

The first group of chips include chips driven in response to a first chip enable signal CE1#, chips driven in response to a second chip enable signal CE2#, chips driven in response to a third chip enable signal CE3#, and chips driven in response to a fourth chip enable signal CE4#. The second group of chips include chips driven in response to the first chip enable signal CE1#, chips driven in response to the second chip enable signal CE2#, chips driven in response to the third chip enable signal CE3#, and chips driven in response to the fourth chip enable signal CE4#.

From a different point of view, the non-volatile memory device includes eight chips 1 to 8 driven in response to the first chip enable signal CE1#, eight chips 9 to 16 driven in response to the second chip enable signal CE2#, eight chips 17 to 24 driven in response to the third chip enable signal CE3#, and eight chips 25 to 32 driven in response to the fourth chip enable signal CE4#.

In order to address eight chips driven in response to each chip enable signal, the first and second chip select signals CS1_INT and CS2_INT are not sufficient. Thus, there is a need for a construction capable of additionally discriminating chips in addition to the chip select signals.

To this end, in the present invention, eight chips driven in response to each chip enable signal are divided into two portions and then connected to data I/O channels. That is, a first I/O channel IO0<7:0> and a second I/O channel IO1<7:0> are constructed to input and output different data.

For example, assuming that the number of chips driven in response to a first chip enable signal is eight, the number of chips that can be discriminated using a first chip select signal and a second chip select signal is four. That is, pair of chips to which the first chip select signal and the second chip select signal are applied identically. The I/O channels are connected differently so that different data is input and output in driving the two chips.

Description is provided referring to the table of FIG. 4 as an example.

A chip No. 1 is driven in response to a first chip enable signal and is selected when a low-level signal is transferred as the first chip select signal and a low-level signal is transferred as a second chip select signal. A chip No. 6 is also selected when a low-level signal is transferred as a first chip select signal and a low-level signal is transferred as a second chip select signal. In other words, the chips No. 1 and No. 6 are selected identically, but the chip No. 1 is connected to the first I/O channel and the chip No. 6 is connected to the second I/O channel. Thus, data input to and output from the chips No. 1 and No. 6 are different. The I/O channels are applied with various commands for driving a non-volatile memory device, addresses, external data, and so on. The I/O channels can discriminate between respective chips.

A construction in which the chips No. 1 and No. 6 are selected is described below with reference to FIG. 2.

The chips No. 1 and No. 6 are chips driven in response to the first chip enable signal. Hence, the chips have only the second chip enable control pad 227 connected to the ground voltage (Vssq) pad 226 and the first chip enable control pad 223 is in a floating state.

Since the second chip enable control pad 227 is connected to the ground voltage (Vssq) pad 226, the signal activates the first chip enable signal transfer unit 230 through the control signal transfer unit 250 and the control signal converter 270. Accordingly, the first chip enable signal is output through the first chip enable signal transfer pad 221 and the first chip enable signal transfer unit 230.

The chips No. 1 and No. 6 are chips in which the first chip select pad 225 and the third chip select pad 228 are connected to the ground voltage (Vssq) pad 226.

Hence, the first chip select signal CS1_INT of a low level and the second chip select signal CS2_INT of a low level are applied to the chip select unit 280.

Furthermore, the chip select unit 280 drives a corresponding chip in response to the first and second chip select signals. Thus, the chips No. 1 and No. 6 are driven at the same time.

In other words, the chip select unit 280 drives a specific chip according to the level of the first and second chip select signals shown in FIG. 4.

As described above, according to the present invention, in a non-volatile memory device to which four chip enable signals are applied, a maximum of thirty-two chips can be laminated and the thirty-two chips can be controlled independently. Accordingly, the entire capacity of a non-volatile memory device can be increased. As one having ordinary skill in the art would appreciate, this method can be applied to not only non-volatile memory devices, but to other semiconductor memory devices, etc.

The embodiments disclosed herein have been proposed to allow a person skilled in the art to easily implement the present invention, and the person skilled in the part may implement the present invention by a combination of these embodiments. Therefore, the scope of the present invention is not limited by or to the embodiments as described above, and should be construed to be defined only by the appended claims and their equivalents.

What is claimed is:

1. A chip select controller, comprising:
   a first chip enable signal transfer unit for buffering a first chip enable signal and a second chip enable signal according to a level of a control signal;
   a second chip enable signal transfer unit for buffering a third chip enable signal and a fourth chip enable signal according to the level of the control signal;
   a first chip select pad connected to a ground voltage pad or a power supply voltage pad, wherein the first chip select pad is configured to transfer a first chip select signal;
   a second chip select pad selectively connected to the power supply voltage pad, wherein the second chip select pad is configured to transfer a second chip select signal;
   a third chip select pad selectively connected to the ground voltage pad, wherein the third chip select pad is configured to transfer the second chip select signal; and
   a chip select unit for addressing a specific chip according to the first chip select signal and the second chip select signal.

2. The chip select controller of claim 1, wherein the second chip enable signal transfer unit is inactivated when the control signal to activate the first chip enable signal transfer unit is applied.

3. The chip select controller of claim 1, further comprising:
   a first chip enable control pad for transferring a ground voltage as the control signal;
   a second chip enable control pad for transferring a power supply voltage as the control signal;
   a control signal transfer unit for buffering the control signal; and
   a control signal converter for transferring an output signal of the control signal transfer unit to the first chip enable signal transfer unit, for inverting the output signal of the control signal transfer unit and for transferring the inverted signal to the second chip enable signal transfer unit.

4. The chip select controller of claim 3, wherein the control signal converter comprises an inverter connected between the control signal transfer unit and the second chip enable signal transfer unit.

5. The chip select controller of claim 1, further comprising:
   a first chip enable control pad for transferring a ground voltage as the control signal;
   a second chip enable control pad for transferring a power supply voltage as the control signal;
   a control signal transfer unit for buffering the control signal; and
   a control signal converter for transferring the inverted signal of the control signal transfer unit to the first chip enable signal transfer unit, and for transferring the output signal of the control signal transfer unit to the second chip enable signal transfer unit.

6. The chip select controller of claim 5, wherein the control signal converter includes an inverter connected between the control signal transfer unit and the first chip enable signal transfer unit.

7. The chip select controller of claim 1, wherein:
   when the second chip select pad is connected to the power supply voltage pad, the third chip select pad becomes a floating state, and
   when the third chip select pad is connected to the ground voltage pad, the second chip select pad becomes a floating state.

8. The chip select controller of claim 1, further comprising a chip select signal transfer unit for buffering the second chip select signal and for transferring the second chip select signal to the chip select unit.

9. A non-volatile memory device, comprising:
   a first group of chips which each include the chip select controller according to claim 1, wherein the first group of chips are laminated to connect to a first I/O pad, and
   a second group of chips which each include the chip select controller according to claim 1, wherein the second group of chips are laminated to connect to a second I/O pad.

10. The non-volatile memory device of claim 9, wherein the first group of chips includes chips driven in response to a first chip enable signal, chips driven in response to a second chip enable signal, chips driven in response to a third chip enable signal, and chips driven in response to a fourth chip enable signal.

11. The non-volatile memory device of claim 9, wherein the second group of chips includes chips driven in response to a first chip enable signal, chips driven in response to a second chip enable signal, chips driven in response to a third chip enable signal, and chips driven in response to a fourth chip enable signal.

12. The non-volatile memory device of claim 9, wherein chips selected by a chip select unit in response to the first chip select signal and the second chip select signal include one chip belonging to the first group and one chip belonging to the second group.

13. The non-volatile memory device of claim 9, wherein the number chips in the first group is sixteen and the number of chips in the second group is sixteen.

* * * * *